United States Patent [19]

Berasi et al.

[11] Patent Number: 5,170,058
[45] Date of Patent: Dec. 8, 1992

[54] APPARATUS AND A METHOD FOR ALIGNMENT VERIFICATION HAVING AN OPAQUE WORK PIECE BETWEEN TWO ARTWORK MASTERS

[75] Inventors: Peter H. Berasi, Hopewell Junction; Lannie R. Bolde, New Paltz, both of N.Y.

[73] Assignee: International Business Machines Corporation, Armonk, N.Y.

[21] Appl. No.: 784,867

[22] Filed: Oct. 30, 1991

[51] Int. Cl.$^5$ ............................................. G01V 9/04
[52] U.S. Cl. .................................... 250/548; 356/401
[58] Field of Search ............... 250/548, 557; 356/400, 356/401

[56] References Cited

U.S. PATENT DOCUMENTS

| | | | |
|---|---|---|---|
| 2,994,783 | 8/1961 | Looschen | 250/219 |
| 3,525,872 | 8/1970 | Schneider | 250/219 |
| 3,963,489 | 6/1976 | Cho | 96/27 R |
| 4,454,209 | 6/1984 | Blais | 430/5 |
| 4,662,753 | 5/1987 | Yabu | 250/548 |
| 4,761,561 | 8/1988 | Fujiwara et al. | 250/548 |
| 4,835,078 | 5/1989 | Harvey et al. | 430/22 |
| 4,904,087 | 2/1990 | Harvey et al. | 356/400 |
| 4,937,459 | 6/1990 | Ina | 250/548 |

OTHER PUBLICATIONS

"Metal Mask Dedicated Carrier" IBM Technical Disclosure Bulletin, vol. 34, No. 1, pp. 321-324 (Jun. 1991).

Primary Examiner—David C. Nelms
Assistant Examiner—Que T. Le
Attorney, Agent, or Firm—Aziz M. Ahsan

[57] ABSTRACT

The present invention relates generally to a new apparatus and a method for alignment verification. More particularly, the invention encompasses an apparatus that allows the imaging on a structure from opposite sides while the imaging masks are on the opposite sides of the structure, and the masks and the structure are all aligned with each other. This apparatus also discloses means that can verify that the two imaging masks that are on the opposite sides of each other are aligned with each other during imaging processing.

18 Claims, 1 Drawing Sheet

APPARATUS AND A METHOD FOR ALIGNMENT VERIFICATION HAVING AN OPAQUE WORK PIECE BETWEEN TWO ARTWORK MASTERS

FIELD OF THE INVENTION

The present invention relates generally to a new apparatus and a method for alignment verification. More particularly, the invention encompasses an apparatus that allows the imaging on a structure from opposite sides while the imaging masks are on the opposite sides of the structure, and the masks and the structure are all aligned with each other. This apparatus also discloses means that can verify that the two imaging masks that are on the opposite sides of each other are aligned with each other during imaging processing.

BACKGROUND OF THE INVENTION

Fabrication of stencils used in thick film screening processes requires precise image generation methods to produce matching images on opposite sides of the opaque material used to form the stencils. The two image patterns must be perfectly aligned so that process chemicals acting on the opposite surfaces remove material in the pattern area in such a way to establish proper relationship of the resulting images with respect to each other. Any misalignment of the images during the stencil fabrication process results in fabrication of a defective stencil.

The current alignment process that is used by some companies in the electronic industry for alignment of images is the ball and cone method. This is a manual process where the planar master artwork plate is securely held by planar fixtures. A planar stencil or metal foil having a coating of a photoresist on both surfaces is then inserted between the two fixtures. The two fixtures holding the artwork plates are brought together and balls on one fixture are inserted into inverted hollow cones that are part of the second fixture. The fixtures provide a registration of two artwork plates to each other but there is no verification of the aligned artwork.

Similarly, the prior art does not allow for the verification of master image alignment prior to image transfer onto the stencil. The presently known techniques require that the master image plates be aligned prior to the transfer of image onto the stencil that is being fabricated. Alignment of the master image plates is assumed to be maintained during all subsequent image transfers.

Alignment before and during processing is done for a variety of reasons. For example, in a manufacturing type operation it may be important to control or continuously monitor a series of successive intervals, such as disclosed in U.S. Pat. No. 2,994,783 (Looschen) or recognition of a pattern on a workpiece to enable a subsequent operation to be executed upon the workpiece in a precise manner, such as discussed in U.S. Pat. No. 3,525,872 (Schneider).

U.S. Pat. No. 3,963,489 (Cho) discloses another reason for alignment. This patent shows a method for alignment of pattern-defining masks to each other, to enable pattern creation on a substrate between the two masks. Similarly, U.S. Pat. Nos. 4,835,078 and 4,904,087 (Harvey) show a method for alignment of two photomasks to each other prior to the insertion of a wafer between the two photomasks. The two photomasks are held aligned to each other and are not allowed to move, while the object or wafer to be processed can be freely inserted or removed between these two aligned photomasks without any consideration whether or not the object or wafer is aligned to the two photomasks.

The method of this subject invention not only teaches the alignment of the two artwork plates but also the alignment between the two artwork plates and a planar substrate. Furthermore, this invention discloses a means for verification of image pattern registration at a point when registration is most critical, namely, when the master image plates are in direct contact with the planar substrate immediately preceding the image generation process. This insures registration accuracy on each image transfer. This method may be utilized in any system requiring two side registration of pattern masters onto an opaque substrate.

OBJECTS AND SUMMARY OF THE INVENTION

The invention is a novel method and an apparatus for alignment and alignment verification. Therefore, one object of this invention is to provide an apparatus and a method that will insure alignment between the object to be processed from both sides and the two masks that provide the image onto the two sides of the object.

Another object of this invention is to provide verification of artwork registration following insertion of an opaque work piece between two artwork masters.

Still another object of this invention is the elimination of loss of registration or alignment accuracy through the repeated usage or replication process.

Yet another object of this invention is to provide alignment mechanism in fabrication of electronic circuit elements, which is increasingly difficult to achieve due to increasing circuit densification and image reduction.

In one aspect this invention comprises a method for alignment comprising:

a) means for aligning at least one first artwork plate having at least one first alignment mark, b) means for aligning at least one second artwork plate having at least one second alignment mark, c) means for aligning at least one planar substrate having a first surface and a second surface, wherein said at least one planar substrate has at least one planar substrate alignment mark, d) positioning said at least one first artwork plate such that said first artwork plate faces said first surface of said at least one planar substrate, and positioning said at least one second artwork plate such that said second artwork plate faces said second surface of said at least one planar substrate, and aligning said at least one first alignment mark, said at least one planar substrate alignment mark and said at least one second alignment mark to each other.

In another aspect this invention comprises an apparatus for alignment comprising:

a) at least one first artwork plate having at least one first alignment mark, b) at least one second artwork plate having at least one second alignment mark, c) at least one planar substrate having a first surface and a second surface, wherein said at least one planar substrate has at least one planar substrate alignment mark, d) said at least one first artwork plate faces said first surface of said at least one planar substrate, said at least one second artwork plate faces said second surface of said at least one planar substrate, such that said at least one first alignment mark, said at least one planar substrate alignment mark and said at least one second alignment mark are all aligned to each other.

BRIEF DESCRIPTION OF THE DRAWINGS

The features of the invention believed to be novel and the elements characteristic of the invention are set forth with particularity in the appended claims. The FIGURES are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
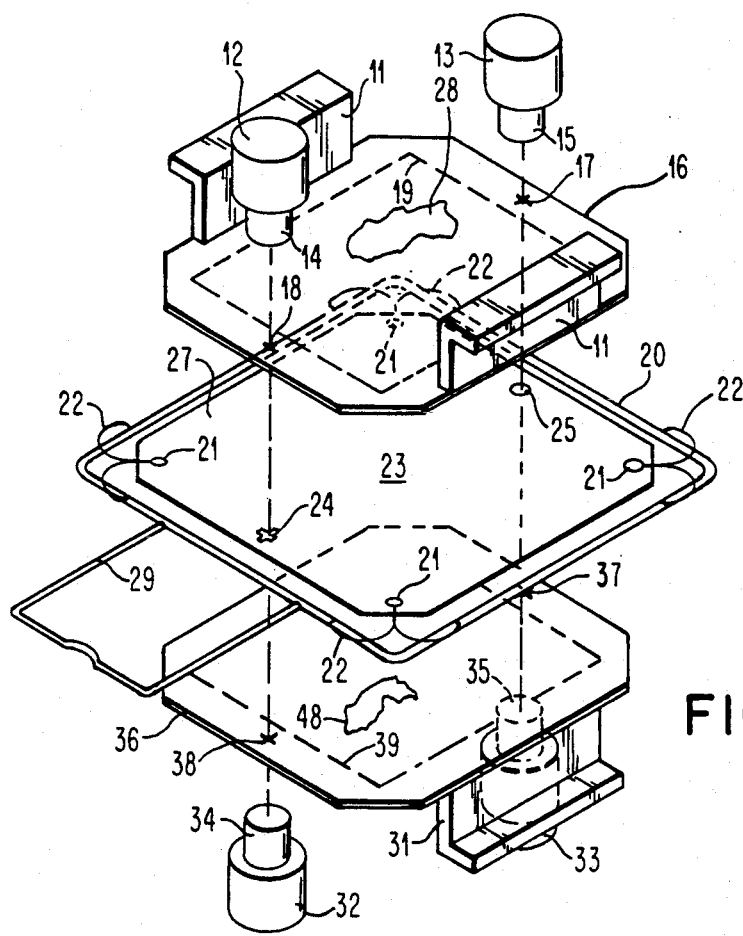
FIG. 1, illustrates an exploded view of a preferred embodiment of this invention.
Figure 2:
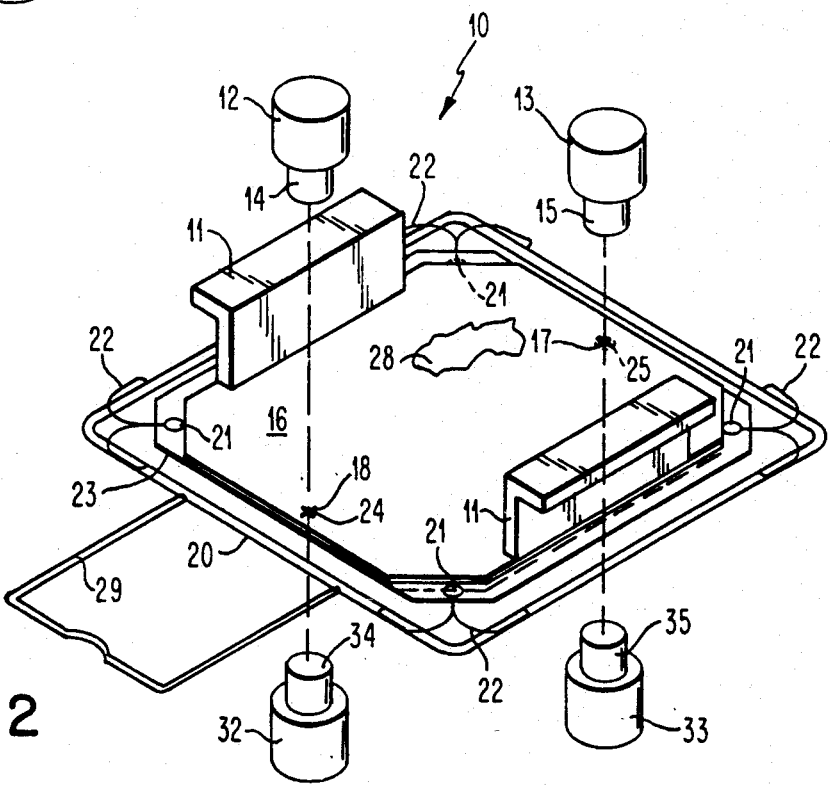
FIG. 2, illustrates the typical expose position for the preferred embodiment of this invention, and further showing the alignment of the various components of the preferred embodiment.

The preferred embodiment is discussed herein with reference to making of a stencil from two artwork plates, but the method or apparatus of this invention can be as easily used with other processes, such as a planar substrate that needs precise imaging on both of its planar surfaces. As shown in FIGS. 1 and 2, the apparatus 10, has a planar substrate 23, that is positioned between two artwork plates 16 and 36. The planar substrate 23, such as a stencil foil or a metal foil 23, is used to prepare stencils that are eventually used in the screening process to make electronic components, such as printed circuit patterns on a substrate. The planar substrate or stencil foil 23, normally has a coating of a photo sensitive material 27, as presently photolithographic techniques are one of the best ways for making these stencils. The planar substrate or stencil foil 23, that is used to fabricate stencils for use in film screening processes, are normally made from single layer or multilayered or alloyed material, are extremely thin and can be easily damaged. Because the planar substrate or stencil foil 23, normally is of an opaque material, such as a single or multilayer or alloyed metal foil, the foil 23, should have at least one, and preferably two or more, inspection ports or openings or planar substrate alignment marks 24 and 25, for the passage of a signal, such as light. Other types of signals that could pass through could be a laser beam signal, an electromagnetic signal or an infrared signal, to name a few. These planar substrate alignment marks or openings or inspection ports 24 or 25, are preferably in a non-imaging area.

In order to obtain a good stencil the process requires that the planar substrate 23, be held rigid prior to and during the photolithographic process. To accomplish this, a foil or substrate carrier 20, is mounted in a load-/unload station, such as disclosed in "Dedicated Carrier Load/Unload Station", IBM Technical Disclosure Bulletin, Vol. 34, No. 6, pages 154-156 (November 1991), the disclosure of which is incorporated herein by reference. Typically, the foil or substrate carrier 20, is a little larger than the stencil foil or planar substrate 23, and is of the same general shape as the stencil foil 23. The foil carrier 20, is made up of a rigid body frame having a handle 29, with specially designed springs 22, preferably in each corner in case of a rectangular foil carrier 20, such as disclosed in "Metal Mask Dedicated Carrier", IBM Technical Disclosure Bulletin, Vol. 34, No. 1, pages 321-324 (June 1991), the disclosure of which is incorporated herein by reference. The springs 22, are compressed towards the center of the carrier frame to allow a hook on each spring 22, to coincide with tooling holes 21, preferably on each corner of the stencil foil 23, that is also rectangular in shape. The stencil foil 23, is then hooked onto the carrier spring hooks and held taut by the outward tension of the springs 22.

Prior to the insertion of the stencil foil 23, into the foil carrier 20, at least a portion of each of the planar foil surfaces can be coated with a photo sensitive material 27, such as a photo resist, which is utilized in the image transfer process. Alternatively, this deposition of the photo sensitive material on the two planar surfaces of the stencil foil 23, can be done while the foil 23, is being held taut by the spring 22. This can be accomplished by dipping the entire foil carrier 20, carrying the foil 23, into a bath containing the photo sensitive material 27, and pulling the foil carrier 20, out of the bath using the handle 29.

At least one artwork plate mounting block 11, securely holds a planar artwork plate 16, while the planar master artwork plate 36, is securely held by artwork plate mounting block 31. The master artwork plates 16 and 36, contain the pattern images 28 and 48, within the image area 19 and 39, respectively, which are to be transferred to the photo resist 27, such as by exposure to UV light, within the image area on the foil 23. These pattern images 28 and 48, must be precisely located to each other during the imaging process. To accomplish this, at least one, and preferably two or more, alignment marks 17 and 18, are provided in the artwork plate 16. Similarly, at least one, and preferably two or more, alignment marks 37 and 38, are provided in the artwork plate 36. The alignment marks that are typically used in the industry are cross-hair or bulls eye or similar such marks, and these marks are provided on the master artwork plates 16 and 36. These alignment marks are preferably provided in a non-functional or non-imaging area of the artwork plate which have true position locational relationship to the functional pattern images. These alignment marks should of course coincide with inspection port or openings 24 and 25, located on the foil 23. This allows the alignment marks on the two adjacent plates to be visually inspected while the metal foil 23, is in the expose position between the plates 16 and 36, as shown in FIG. 2.

Once alignment is made, the plates 16 and 36, normally are brought closer to the stencil foil 23, and in some cases at least a portion of the plates 16 and 36, also make direct physical contact with at least a portion of the photo sensitive material 27, that is on both sides of the foil 23. However, in order to get the best image the two artwork plates 16 and 36, should be in physical contact with at least a portion of the photo sensitive material 27, that is on opposite sides of the planar substrate or stencil foil 23. In this position, the alignment marks 17 and 37, and 18 and 38, respectively, are reinspected to verify precise alignment prior to the pattern transfer process. The artwork plates 16 and 36, and carrier frame 20, with spring 22, attachments are sized so as to allow the plates 16 and 36, to make direct physical contact with the surfaces of the resist coated foil 23.

A vision system 12, 13, 32 and 33, having at least one transreceiver 14, 15, 34 and 35, respectively, can be used to automatically electronically align alignment marks 17, 25 and 37, to each other. Similarly, alignment marks 18, 24 and 38, can be electronically aligned to each other. This can also be done manually or automatically to insure that the two adjacent plates 16 and 36, are properly aligned to each other and also to the stencil foil 23. The vision system as disclosed in U.S. Pat. Nos. 4,835,078 and 4,904,087 (Harvey) could also be used with this invention. Other types of image processing systems, such as, TV or video image processing systems, with high resolution, using real-time two-dimensional image processing technology with multi-computer systems could also be used with this alignment and/or alignment verification method. Of course it would be obvious to one skilled in the art to take the signal from the vision system and manually or electronically enter it into a computer system for further processing, such as, automatic electronic alignment.

At least one first transreceiver and at least one second transreceiver that are on either side of the at least one planar substrate transmit and receive a signal. The signal transmitted from at least one first transreceiver passes through at least one first alignment mark, at least one planar substrate alignment mark, at least one second alignment mark and is received by the at least one second transreceiver, thereby either making the alignment or verifying the alignment.

The master artwork plates 16 and 36, are preferably glass plates with personalized image defining patterns 28 and 48, respectively, where the patterns 28 and 48, are traditionally made using a photographic emulsion or a chrome film.

The apparatus 10, of this invention in expose position is illustrated in FIG. 2. As can be clearly seen that the artwork plates 16 and 36, that sandwich the foil 23, utilize the vision system along with the alignment marks and inspection ports to insure and verify artwork registration. If during the processing any one of those plates or foils become misaligned, then using the process of this invention they can easily be aligned using either a manual system or the auto-alignment system.

As discussed earlier the apparatus and the method of this invention enables the automatic alignment of the artwork and verification of the artwork alignment following the insertion of the stencil foil, by the use of the vision system, therefore, this method lends itself very well for automated processing.

This invention also allows the inclusion of the alignment marks 24 and 25, in part number design data, in a manner which is locationally accurate relative to the associated functional design data. These marks 24 and 25, are also available as locational reference during further processing of the planar substrate or workpiece 23.

This invention also allows the precise subsequent patterning of the planar substrate 23, because the stencil foil 23, can be again and again placed or positioned between the two artwork plates 16 and 36, without any loss of alignment for subsequent pattern generation.

The alignment scheme of this invention allows the alignment of the two artwork plates 16 and 36, and the planar substrate 23, in any order. For example, the planar substrate 23, could be aligned with the artwork plate 36, before the artwork plate 16, is aligned to the artwork plate 36, and the planar substrate 23.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for alignment comprising:
   a) aligning at least one first artwork plate having at least one first alignment mark,
   b) aligning at least one second artwork plate having at least one second alignment mark,
   c) aligning at least one planar substrate having a first surface and a second surface, wherein said at least one planar substrate has at least one planar substrate alignment mark,
   d) positioning said at least one first artwork plate such that said first artwork plate faces said first surface of said at least one planar substrate, and positioning said at least one second artwork plate such that said second artwork plate faces said second surface of said at least one planar substrate, and aligning said at least one first alignment mark, said at least one planar substrate alignment mark and said at least one second alignment mark are all aligned to each other.

2. The method of claim 1, further comprising at least one first transreceiver and at least one second transreceiver on either side of said at least one planar substrate, wherein a signal transmitted from said at least one first transreceiver passes through said at least one first alignment mark, said at least one planar substrate alignment mark, said at least one second alignment mark and is received by said at least one second transreceiver, thereby verifying said alignment.

3. The method of claim 2, wherein said signal is an electromagnetic signal.

4. The method of claim 1, wherein said at least one planar substrate is at least one metal foil, and wherein said at least one planar substrate alignment mark is an opening.

5. The method of claim 1, wherein at least one of said first alignment mark, at least one of said second alignment mark and at least one of said planar substrate alignment mark is made in a non-imaging area.

6. The method of claim 1, wherein at least a portion of said first surface and at least a portion of said second surface of said at least one planar substrate is coated with a photo sensitive material.

7. The method of claim 1, wherein said at least one planar substrate is held in a substrate carrier.

8. The method of claim 1, wherein at least a portion of said at least one first artwork plate and at least a portion of said at least one second artwork plate physically contacts at least a portion of said first surface and at least a portion of said second surface, respectively, of said at least one planar substrate.

9. The method of claim 1, wherein the material for said at least one planar substrate is an opaque material.

10. An apparatus for alignment comprising:
    a) at least one first artwork plate having at least one first alignment mark,
    b) at least one second artwork plate having at least one second alignment mark,
    c) at least one planar substrate having a first surface and a second surface, wherein said at least one planar substrate has at least one planar substrate alignment mark,
    d) said at least one first artwork plate faces said first surface of said at least one planar substrate, said at least one second artwork plate faces said second surface of said at least one planar substrate, such that said at least one first alignment mark, said at least one planar substrate alignment mark and said at least one second alignment mark are all aligned to each other.

11. The apparatus of claim 10, further comprising at least one first transreceiver and at least one second transreceiver on either side of said at least one planar substrate, wherein a signal transmitted from said at least one first transreceiver passes through said at least one first alignment mark, said at least one planar substrate alignment mark, said at least one second alignment mark and is received by said at least one second transreceiver, thereby verifying said alignment.

12. The apparatus of claim 11, wherein said signal is an electromagnetic signal.

13. The apparatus of claim 10, wherein said at least one planar substrate is at least one metal foil, and wherein said at least one planar substrate alignment mark is an opening.

14. The apparatus of claim 10, wherein at least one of said first alignment mark, at least one of said second alignment mark and at least one of said planar substrate alignment mark is made in a non-imaging area.

15. The apparatus of claim 10, wherein at least a portion of said first surface and at least a portion of said second surface of said at least one planar substrate is coated with a photo sensitive material.

16. The apparatus of claim 10, wherein said at least one planar substrate is held in a substrate carrier.

17. The apparatus of claim 10, wherein at least a portion of said at least one first artwork plate and at least a portion of said at least one second artwork plate physically contacts at least a portion of said first surface and at least a portion of said second surface, respectively, of said at least one planar substrate.

18. The apparatus of claim 10, wherein the material for said at least one planar substrate is an opaque material.

* * * * *